United States Patent [19]
Jeon et al.

[11] Patent Number: 5,374,839
[45] Date of Patent: Dec. 20, 1994

[54] SEMICONDUCTOR MEMORY DEVICE

[75] Inventors: Jun-Young Jeon, Seoul; Hoon Choi; Dong-Il Seo, both of Suwon, all of Rep. of Korea

[73] Assignee: SamSung Electronics Co., Ltd., Kyungki-do, Rep. of Korea

[21] Appl. No.: 40,065

[22] Filed: Mar. 30, 1993

[30] Foreign Application Priority Data

Oct. 31, 1992 [KR] Rep. of Korea .............. 1992-20349

[51] Int. Cl.$^5$ .................................................. H01L 27/02
[52] U.S. Cl. .................................. 257/372; 257/373; 257/376; 257/296
[58] Field of Search .............. 257/372, 373, 376, 296

[56] References Cited

U.S. PATENT DOCUMENTS 4,647,956  3/1987  Shrivastava ............... 257/373
5,060,044  10/1991  Tomassetti ............... 257/373

FOREIGN PATENT DOCUMENTS 2-47849  2/1990  Japan ................... 257/376

Primary Examiner—Edward Wojciechowicz
Attorney, Agent, or Firm—Stephen R. Whitt; Robert A. Westerlund; Charles R. Donohue

[57] ABSTRACT

A semiconductor memory device, e.g., a DRAM, which includes a P-type semiconductor substrate, a memory array each memory cell of which includes at least one N-channel MOS transistor, a CMOS peripheral circuit at least partially surrounding the memory array, the peripheral circuit including at least one P-channel MOS transistor formed in an N-type well region formed in the substrate, and at least one N-channel MOS transistor formed in the substrate outside of the N-type well region, and, a P-type minority carrier absorption semiconductor region formed in the substrate between the N-type well region and the memory array. The minority carrier absorption semiconductor region is preferably connected to a source of negative voltage, e.g., the substrate bias voltage, and a separate N-type region formed in the N-type well region is preferably connected to a source of positive voltage, e.g., the power supply voltage, Vdd, of the memory device. The N-type well region functions to absorb or capture hot electrons generated by the N-channel MOS transistor of the CMOS peripheral circuit, and the P-type minority carrier absorption semiconductor region functions to absorb or capture holes which would otherwise combine with the hot electrons to induce substrate current which could deleteriously lower the threshold voltage level of the memory cells of the memory array and thereby degrade the data storage integrity thereof.

18 Claims, 3 Drawing Sheets

SEMICONDUCTOR MEMORY DEVICE

BACKGROUND OF THE INVENTION

The present invention relates generally to semiconductor memory devices, and more particularly, to a semiconductor memory device in which the peripheral circuits are constructed in such a manner as to minimize substrate current while also preventing the injection of hot electrons into the memory cells of the memory array thereof.

In general, semiconductor memory devices include an array of memory cells which are at least partially surrounded by peripheral circuits, including sense amplifiers, address buffers and decoders, I/O circuitry, and the like, which function to enable data to be written into and read from a particularly addressed one(s) of the memory cells. The peripheral circuits are generally CMOS circuits which are configured to absorb hot electrons generated by the outermost/N-channel transistor thereof before they can reach the memory cells, thereby preventing the destruction of the data stored in the memory cells.

With reference now to U.S. Pat. No. 4,497,043, the disclosure of which is incorporated herein by reference thereto, a conventional CMOS peripheral circuit will now be described. More particularly, with additional reference to FIG. 1, there can be seen a semiconductor memory device which includes a CMOS peripheral circuit B which is essentially identical to the one shown in FIG. 2 of U.S. Pat. No. 4,497,043. The semiconductor memory device includes a memory cell array A which is flanked by the CMOS peripheral circuit B. Each individual memory cell Q1 of the memory cell array A includes a transfer gate 18 and a storage capacitor 26. The peripheral circuit B includes a P-channel transistor Q3 formed in an N-type well 38 which is formed in a P-type semiconductor substrate 10, and an N-channel transistor Q2 formed directly in the substrate 10 outside of the P-channel transistor Q3. A power supply voltage Vdd, e.g., 5 volts, is applied to a highly concentrated N-type region 48 separately formed in the N-type well 38, and a negative substrate bias voltage Vbb is applied to the substrate 10.

The storage electrode 20 of the memory cell capacitor 26 is also connected to Vdd, to thereby form an inversion layer 24 beneath the dielectric layer 22 of the capacitor 26. Binary data is represented by the presence or absence of an electron in the inversion layer 24, e.g., a "1" bit is represented by the presence of an electron in the inversion layer 24, and a "0" bit is represented by the absence of an electron in the inversion layer 24. The gate electrode 14 of the transfer gate 18 of each memory cell Q1 constitutes an extension of a word (row) line which is connected to a voltage source WL which goes high during a memory read/write operation, to thereby form an inversion layer in the channel region between the source/drain electrode 16 and the inversion layer 24, beneath the gate insulation layer 14, in order to thereby transfer data into/from the accessed memory cell Q1 from/to the peripheral circuit B.

Further, during a memory read/write operation, the transistors Q2 and Q3 of the peripheral circuit B are activated, which results in hot electrons 36 generated by the N-channel transistor Q2 being injected into the substrate 10. These hot electrons 36 are substantially absorbed or captured by the N-well 38, to thereby prevent these hot electrons 36 from reaching the memory cell Q1 to destroy the integrity of the data stored therein.

With reference to FIG. 2, there can be seen a block diagram depicting the general lay-out of the conventional memory device shown in FIG. 1, wherein the memory cell array A is completely surrounded by regions 50 which include the P-channel transistors Q3 of the peripheral circuit B, and regions 52 which include the N-channel transistors Q2 of the peripheral circuit B. With reference to FIG. 2, it can be more easily visualized how the P-channel transistors Q3 serve to absorb minority carriers generated by the N-channel transistors Q2 to prevent them from reaching the memory cell array A.

Although the CMOS peripheral circuit of the above-described conventional memory device does function to prevent hot electrons from reaching the memory array, it suffers from the following drawback. More particularly, holes in the substrate 10 tend to combine with the injected hot electrons 36 to form electron-hole pairs which increase substrate current, which, in turn, disadvantageously decreases the threshold voltage of the memory cells Q1 of the memory cell array A, thereby lowering the noise immunity of the memory cells Q1 and lowering the electrical insulation between adjacent memory cells Q1 of the memory cell array A. Consequently, the integrity of the data stored in the memory cell array A is degraded.

Based upon the above and foregoing, it can be appreciated that there presently exists a need in the semiconductor art for a semiconductor memory device which eliminates the above-described shortcomings and disadvantages of the presently available semiconductor memory devices. The present invention fulfills this need.

SUMMARY OF THE INVENTION

In one of its aspects, the present invention encompasses a semiconductor memory device, e.g., a DRAM, which includes a P-type semiconductor substrate, a memory array each memory cell of which includes at least one N-channel MOS transistor, a CMOS peripheral circuit at least partially surrounding the memory array, the peripheral circuit including at least one P-channel MOS transistor formed in an N-type well region formed in the substrate, and at least one N-channel MOS transistor formed in the substrate outside of the N-type well region, and, a P-type minority carrier absorption semiconductor region formed in the substrate between the N-type well region and the memory array. The minority carrier absorption semiconductor region is preferably connected to a source of negative voltage, e.g., the substrate bias voltage, and a separate N-type region formed in the N-type well region is preferably connected to a source of positive voltage, e.g., the power supply voltage, Vdd, of the memory device. The N-type well region functions to absorb or capture hot electrons generated by the N-channel MOS transistor of the CMOS peripheral circuit, and the P-type minority carrier absorption semiconductor region functions to absorb or capture holes which would otherwise combine with the hot electrons to induce substrate current which could deleteriously lower the threshold voltage level of the memory cells of the memory array and thereby degrade the data storage integrity thereof.

In another of its aspects, the present invention encompasses a semiconductor memory device comprised of a plurality of memory arrays surrounded on three sides by a peripheral circuit like that described above, and a peripheral circuit arrangement disposed between adjacent ones of the memory arrays, outside of an additional minority carrier absorption semiconductor region which flanks the fourth side of each of the memory arrays. The peripheral circuit arrangement preferably includes a first region which includes at least one P-channel MOS transistor formed in a first N-type well region, a second region which includes at least one P-channel MOS transistor formed in a second N-type well region, and a third region which includes at least one N-channel MOS transistor formed in the substrate between the first and second regions. The first and second N-type well regions are preferably connected to a source of positive voltage, e.g., Vdd.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1:
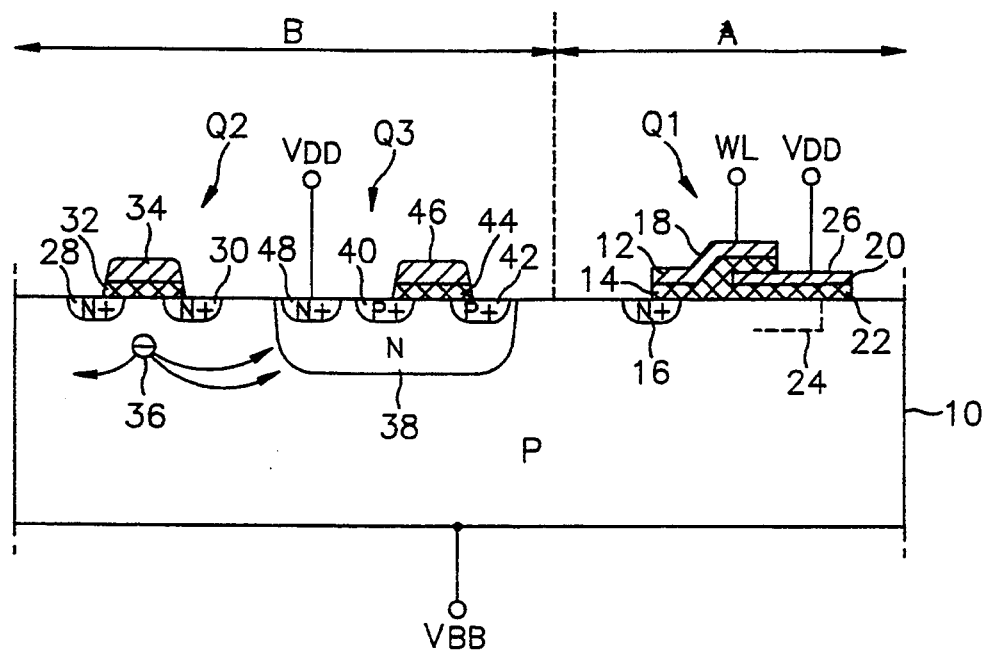
FIG. 1 is a schematic, cross-sectional view of the circuit structure of a conventional semiconductor memory device.
Figure 2:
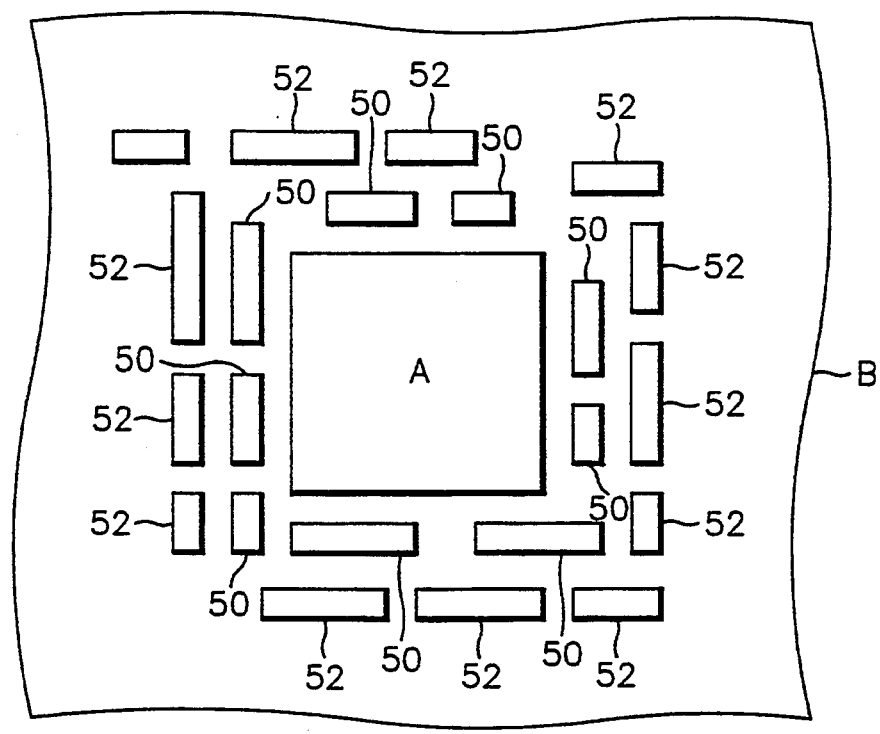
FIG. 2 is a plan view, block diagram of the conventional semiconductor memory device depicted in FIG. 1.
Figure 3:
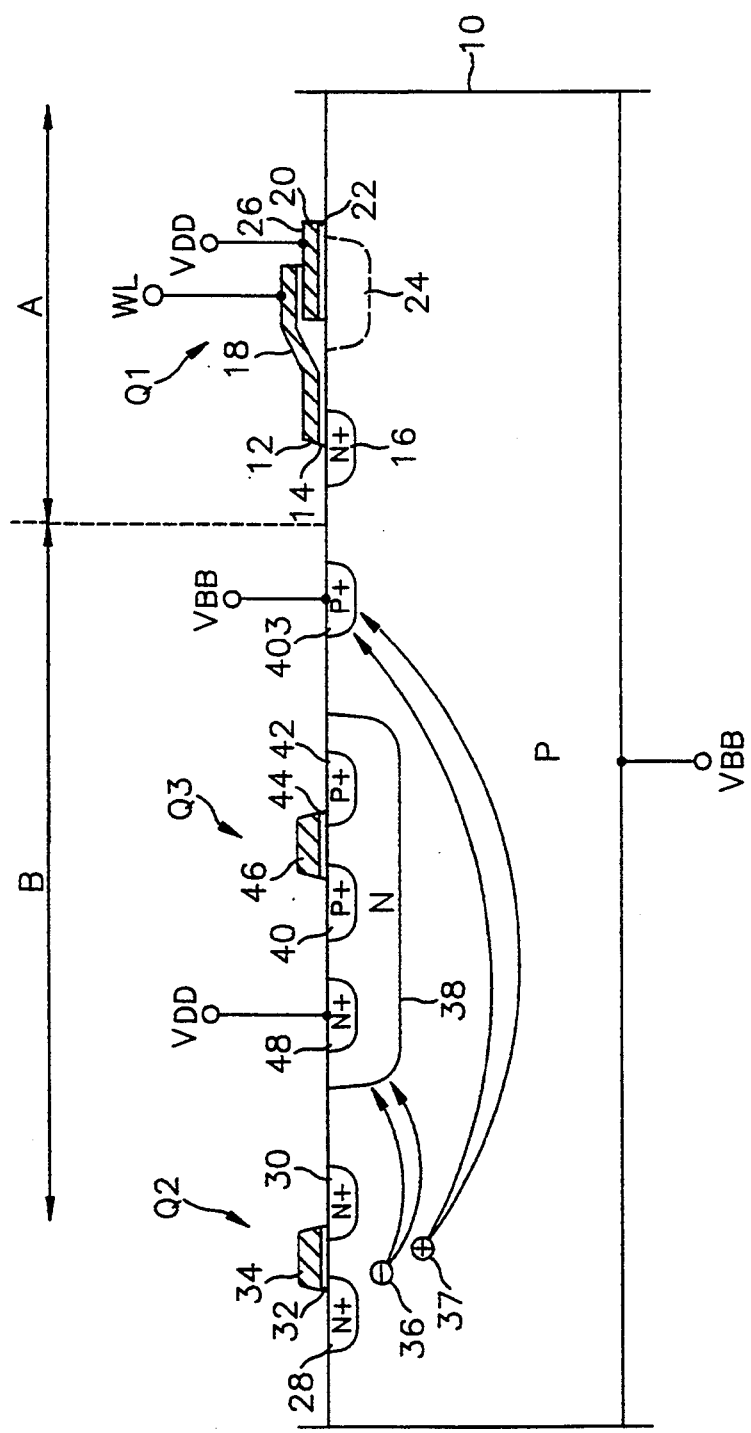
FIG. 3 is a schematic, cross-sectional view of the circuit structure of a semiconductor memory device constructed in accordance with a preferred embodiment of the present invention; and, FIG. 4 is a plan view, block diagram of the semiconductor memory device depicted in FIG. 3.

With reference now to FIG. 3, a semiconductor memory device constructed in accordance with a preferred embodiment of the present invention will now be described. More particularly, the semiconductor memory device includes a memory cell array A which is flanked by a CMOS peripheral circuit B. The construction of the memory cell array A and the CMOS peripheral circuit B are identical to that of the conventional semiconductor memory device depicted in FIG. 1 and described hereinabove, except that an additional P-type region or layer 403 is formed in the P-type substrate 10 between the N-type well 38 and the memory cell array A. The P-type region 403 is preferably formed of a high concentration of P-type impurities. The P-type region 403 is connected to a source of negative voltage, preferably, Vbb (i.e., the negative substrate bias voltage).

During a memory read/write operation, in addition to the hot electrons 36 generated by the N-channel transistor Q2 being absorbed or captured by the N-type well 38, the holes 37, which would otherwise combine with the hot electrons to form electron-hole pairs, are absorbed or captured by the P-type region 403 impressed with the negative substrate bias voltage. Accordingly, the substrate current which would otherwise be caused by the electron-hole pairs is eliminated, thereby advantageously increasing the threshold voltage of the memory cells Q1 of the memory cell array A, and, in turn, enhancing the data storage integrity thereof.

Figure 4:
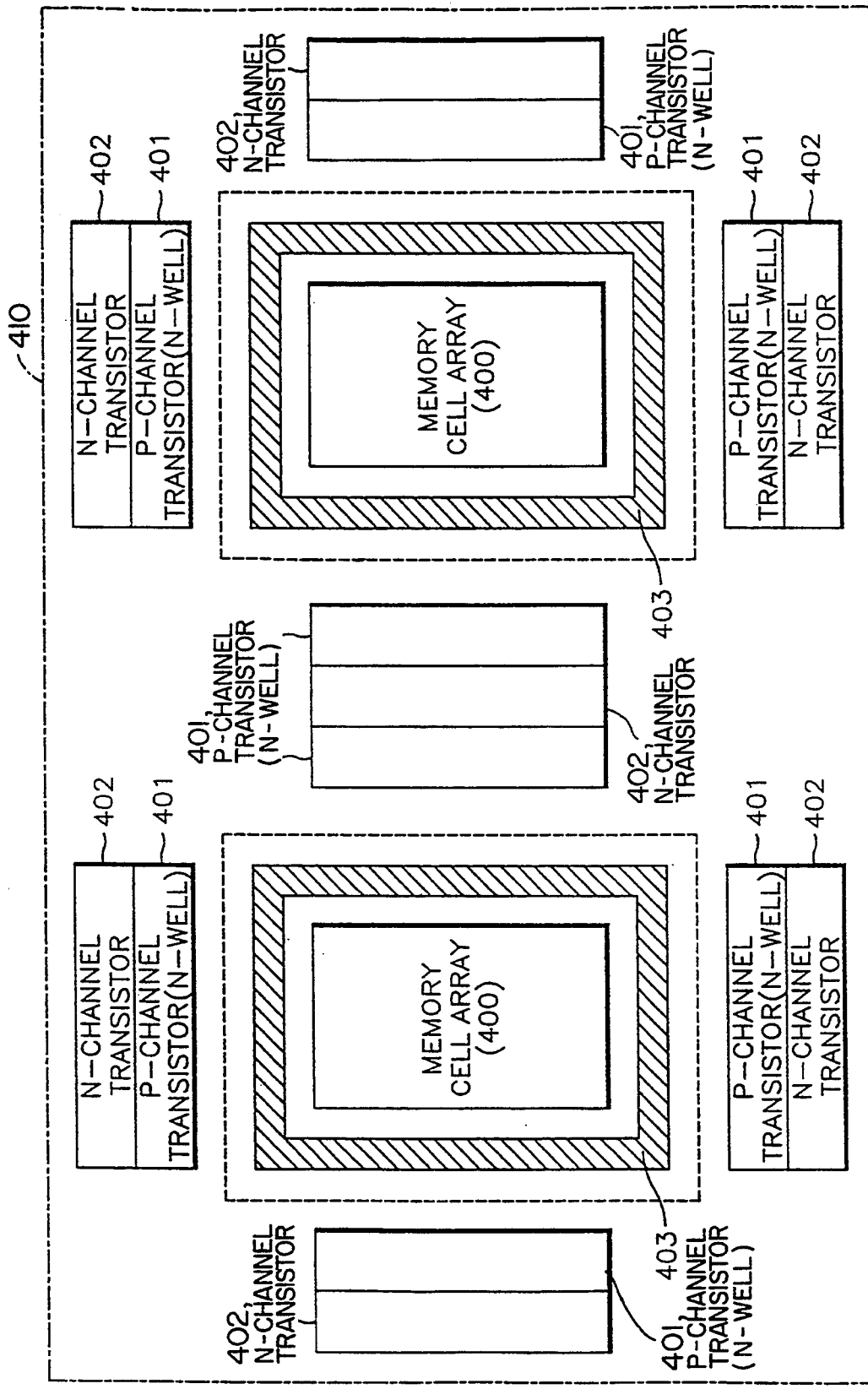

With reference now to FIG. 4, another aspect of the present invention will now be described. More particularly, in accordance with this aspect of the present invention, the memory cell array A is divided into a plurality, illustratively shown as two, memory cell arrays 400 (sometimes referred to as memory blocks or sub-arrays), separated by a peripheral circuit portion comprised of regions 401 disposed on opposite sides of a region 402, wherein the regions 401 include at least one P-channel transistor formed in an N-well and the region 402 includes at least one N-channel transistor formed in the substrate 10. Further, in accordance with this aspect of the invention, each of the memory cell arrays 400 is at least partially surrounded by the P-type region 403 formed in the substrate 10 between the regions 401 and the memory cell arrays 400. Further, the memory cell arrays 400 are preferably surrounded on their other three sides by CMOS peripheral circuits having the structure shown in FIG. 3.

Although the present invention has been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. A semiconductor memory device, comprising:
   a P-type semiconductor substrate;
   a memory array including a plurality of memory cells, each memory cell comprising at least one N-channel MOS transistor and at least one storage capacitor;
   a CMOS peripheral circuit at least partially surrounding said memory array, said CMOS peripheral circuit including at least one P-channel MOS transistor formed in an N-type well region formed in said substrate, and at least one N-channel MOS transistor formed in said substrate outside said N-type well region, such that said N-type well region is interposed between said at least one N-channel MOS transistor and said memory array to thereby absorb hot electrons generated by said at least one N-channel MOS transistor; and,
   a P-type region formed in said substrate between said N-type well region and said memory array to thereby absorb holes generated by said at least one N-channel MOS transistor.

2. The memory device as set forth in claim 1, wherein said P-type region is connected to a source of negative voltage.

3. The memory device as set forth in claim 2, further comprising an N-type region formed in said N-type well region and connected to a source of positive voltage.

4. The memory device as set forth in claim 3, wherein said negative voltage comprises a substrate bias voltage.

5. The memory device as set forth in claim 4, wherein said positive voltage comprises a power supply voltage for said memory device.

6. A semiconductor memory device, comprising:
   a semiconductor substrate of first conductivity type;
   a plurality of memory arrays formed in said substrate, each memory array comprising a matrix of memory cells, and each memory cell comprising a MOS storage capacitor and a MOS transistor having a channel of first conductivity type;

at least one CMOS peripheral circuit formed in said substrate and disposed proximate the periphery of one of said plurality of memory arrays; and, a minority carrier absorption region of first conductivity type formed in said substrate surrounding at least one of said plurality of memory arrays, such that said minority carrier absorption region is interposed between said at least one of said plurality of memory arrays and said at least one CMOS peripheral circuit to thereby absorb holes generated by said at least one CMOS peripheral circuit.

7. The memory device as set forth in claim 6, wherein said first conductivity type is P-type and said first channel type is N-type.

8. The memory device as set forth in claim 6, wherein said minority carrier absorption region is connected to a source of negative voltage.

9. The memory device as set forth in claim 8, wherein said at least one CMOS peripheral circuit includes a a first N-type well region formed in said substrate adjacent to said minority carrier absorption region including at least one P-channel MOS transistor formed in said first N-type well region, and a second region including at least one N-channel MOS transistor, wherein said first region is disposed between said second region and said periphery of said at least one of said plurality of memory arrays.

10. The memory device as set forth in claim 9, further comprising a separate N-type region formed in said N-type well region, said separate N-type region being connected to a source of positive voltage.

11. The memory device as set forth in claim 10, wherein said substrate is connected to a negative substrate bias voltage, and said source of negative voltage comprises said substrate bias voltage.

12. The memory device as set forth in claim 6, wherein said minority carrier absorption region substantially surrounds said plurality of memory arrays.

13. The memory device as set forth in claim 6, wherein said at least one CMOS peripheral circuit includes a first peripheral circuit disposed between adjacent first and second ones of said plurality of memory arrays, said first peripheral circuit comprising:

first region, proximate said first one of said plurality of memory arrays, including a well region of second conductivity type, and at least one transistor having a channel of first conductivity type formed in said well region;

second region, proximate said second one of said plurality of memory arrays, including a well region of second conductivity type, and at least one transistor having a channel of first conductivity type formed in said well region; and, third region, disposed between said first and second regions, including at least one transistor having a channel of second conductivity type.

14. The memory device as set forth in claim 13, wherein said at least one CMOS peripheral circuit includes a second peripheral circuit comprising:

a fourth region including a well region of second conductivity type, and at least one transistor having a channel of first conductivity type formed in said well region; and, fifth region including at least one transistor having a channel of second conductivity type;

wherein said fourth region is disposed between said fifth region and said outer periphery of said at least one of said plurality of memory arrays.

15. The memory device as set forth in claim 14, wherein each one of said plurality of memory arrays is formed in a rectangular pattern having first, second, third, and fourth sides.

16. The memory device as set forth in claim 15, wherein said first peripheral circuit is disposed adjacent respective first sides of said first and second ones of said plurality of memory arrays, and wherein respective second peripheral circuits are disposed adjacent to each one said second, third, and fourth sides of said first and second ones of said plurality of memory arrays.

17. The memory device as set forth in claim 14, wherein at least one of said well regions in said first, second, and fourth regions is connected to a source of positive voltage, and wherein said minority carrier absorption region is connected to a source of negative voltage.

18. The memory device as set forth in claim 17, wherein said substrate is connected to said source of negative voltage.

* * * * *